United States Patent
Bahramian

(10) Patent No.: US 7,167,043 B2
(45) Date of Patent: Jan. 23, 2007

(54) DECOUPLING CIRCUIT FOR CO-PACKAGED SEMICONDUCTOR DEVICES

(75) Inventor: Tony Bahramian, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/993,951

(22) Filed: Nov. 19, 2004

(65) Prior Publication Data

US 2005/0111157 A1 May 26, 2005

Related U.S. Application Data

(60) Provisional application No. 60/525,412, filed on Nov. 24, 2003.

(51) Int. Cl.
*H04B 1/10* (2006.01)
(52) U.S. Cl. ..................... 327/551; 327/564
(58) Field of Classification Search ............... 327/362, 327/478, 482, 427, 432, 434, 551, 564–566
See application file for complete search history.

(56) References Cited

U.S. PATENT DOCUMENTS

| | | | |
|---|---|---|---|
| 5,646,561 A * | 7/1997 | Fanini et al. ............... 327/110 |
| 5,701,060 A | 12/1997 | Buhler et al. |
| 5,734,564 A * | 3/1998 | Brkovic ................... 363/21.16 |
| 5,812,383 A * | 9/1998 | Majid et al. .............. 363/21.05 |
| 5,814,884 A | 9/1998 | Davis |
| 6,051,804 A * | 4/2000 | Reynolds et al. ....... 219/121.54 |
| 6,133,632 A | 10/2000 | Davis |
| 6,293,942 B1 * | 9/2001 | Goble et al. ................. 606/38 |
| 6,297,552 B1 | 10/2001 | Davis |
| 6,373,331 B1 * | 4/2002 | Smiley et al. .............. 327/545 |
| 6,404,050 B1 | 6/2002 | Davis |
| 6,724,263 B1 * | 4/2004 | Sugiura ....................... 330/302 |
| 6,740,902 B1 | 5/2004 | Oliver |
| 2003/0107413 A1 * | 6/2003 | Bennett ....................... 327/108 |
| 2004/0130379 A1 * | 7/2004 | Bolz et al. ................... 327/374 |
| 2004/0169262 A1 | 9/2004 | Oliver |
| 2005/0146903 A1 * | 7/2005 | Yang et al. ............... 363/21.15 |
| 2005/0206444 A1 * | 9/2005 | Perez .......................... 327/540 |

* cited by examiner

*Primary Examiner*—Timothy P. Callahan
*Assistant Examiner*—Hai L. Nguyen
(74) *Attorney, Agent, or Firm*—Ostrolenk, Faber, Gerb & Soffen, LLP

(57) ABSTRACT

A model for noise coupling in copackaged semiconductor devices due to coupling through parasitic impedances, and a method and decoupling circuit to minimize the effects of such noise. In one example, which is not intended to be limiting either as to the application of the invention or its implementation, a decoupling circuit for a power factor correction IC co-packaged with a power transistor such as an IGBT or MOSFET includes a first branch formed by a capacitor and a parallel branch formed by a resistor and a capacitor in series. The circuit, which is part of the IC, is connected between a power supply node and the circuit ground and, at frequencies associated with the noise, exhibits low impedance to the ground, and a high impedance to the IC and the transistor.

10 Claims, 3 Drawing Sheets

DECOUPLING CIRCUIT FOR CO-PACKAGED SEMICONDUCTOR DEVICES

CROSS REFERENCE TO RELATED APPLICATIONS

This application claims the benefit and priority of U.S. Provisional patent application Ser. No. 60/525,412 filed Nov. 24, 2003 entitled DECOUPLING CIRCUIT FOR COPACKED SEMICONDUCTOR DIE, the entire disclosure of which is incorporated herein by reference.

BACKGROUND OF THE INVENTION

1. Field of the Invention

This invention relates to co-packaged semiconductor devices and more specifically to a decoupling circuit to prevent the noise generated in one co-packaged die from affecting the operation of other co-packaged dice. As understood by those in the art, to "co-package" means to assemble two or more dice in the same package.

2. Relevant Art

It is well known to co-package diverse semiconductor dice on a common board or in a common housing. For example, co-packaging of MOSFETS or IGBTS with gate drivers and other related circuit elements in multichip modules can reduce the effects of printed circuit board layout on the performance of power factor correction (PFC) circuits and dc-dc converters, and can reduce EMI, switching losses and conduction losses. It can also reduce PCB area, thus allowing achievement of higher power density, while reducing component count and the time and cost of assembly.

Examples of co-packaged circuits may be found in commonly assigned U.S. Pat. Nos. 6,740,902, 6,404,050, 6,297,552, 6,133,632, and 5,814,884, and in published U.S. patent application 2004-0169262.

The benefits of co-packaging, however, come at a price: the potential for noise coupling between the co-packaged elements is significantly increased. For example, an IGBT can produce high di/dt when switching on and off, which can affect the operation of co-packaged dice, such as, a closely mounted integrated circuit power factor correction (PFC) integrated circuit or chip.

FIG. 1 shows a semiconductor die 10 which may, for example, be a power transistor such as an IGBT or a MOSFET. This is comounted on a common board or within a common housing with an integrated circuit (IC) 11, which may be a power factor control (PFC) circuit or other circuit which provides control and gate drive for device 10. For convenience, the invention will be described in the context of an IGBT as device 10 and a PFC circuit as device 11, but it is to be understood that the principles of the invention apply as well to other co-packaged devices which are susceptible to noise coupling.

Referring still to FIG. 1, emitter E of the IGBT 10 is coupled to the substrate of IC 11 by a parasitic capacitance 12 (for example, 1.2 PF), associated with an insulating film, formed, for example of a polyimide such as Kapton®. There is also a parasitic lead inductance $L_1$ through which the IC is grounded.

FIG. 2 shows the IC 11 and IGBT 12, along with circuit components to define a conventional PFC circuit, including an inductor 20 and diode 21. The collector 50 of IGBT 10 is connected to a node 22 between inductor 20 and diode 21, and its emitter 52 is connected to ground through a parasitic inductance $L_2$ which represents lead, wire-bond, package, and PCB parasitic inductances. FIG. 2 also shows the parasitic capacitance 12 associated with the insulation layer (see FIG. 1). The voltage resulting from large values of di/dt associated with fast switching of IGBT 10 is coupled back through parasitic capacitance 12 to IC 11 as noise.

One way to reduce such noise is to provide a properly designed decoupling circuit, but for this to he effective, the noise source and noise pats must be modeled, i.e. defined and/or simulated based on theoretical parameters, correctly. Up to now, decoupling circuits have been used on single, i.e., individual ICs, but inter-dice noise modeling and use of a decoupling circuit on one IC to dampen the effect of noise from another co-packaged IC has not been done, so far as I am aware. The present invention permits such modeling for closely positioned co-packaged chips or dice.

SUMMARY OF THE INVENTION

In accordance with the invention, a model of the noise coupling mechanism of the co-packaged devices is disclosed, along with a novel decoupling circuit based on the model, which is built into the IC. In the specific context of the example illustrated and described, the decoupling circuit is comprised of a series connection of a damping resistor and a first damping capacitor. This series connection is connected in parallel with a second damping capacitor. This combination, in turn, is connected in series between the positive power supply node ($V_{DD}$) and the ground lead inductance of the IC.

DETAILED DESCRIPTION OF THE INVENTION

Figure 1:
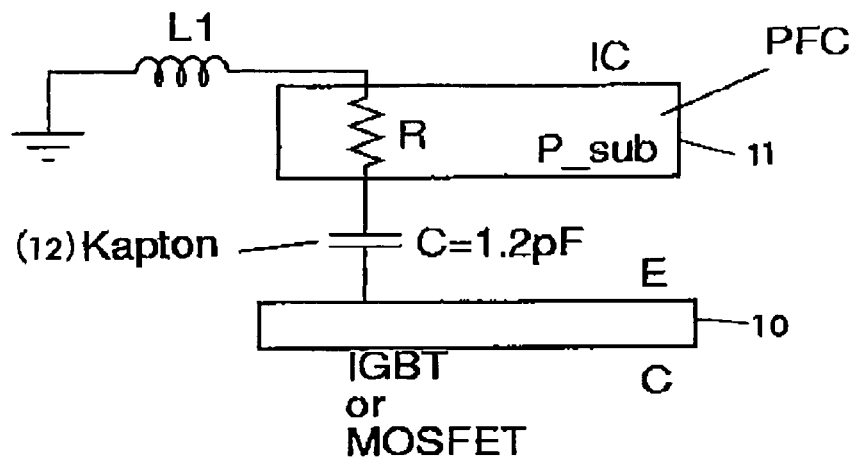
FIG. 1 schematically shows a co-packaged combination of an IGBT die and a PFC IC to illustrate in general exemplary terms, the sources of parasitic noise coupling encountered due to co-packageaging.
Figure 2:
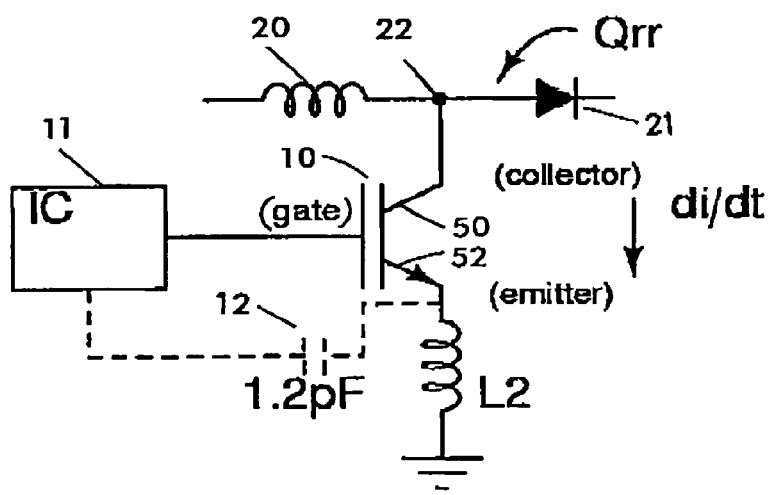
FIG. 2 is a schematic circuit diagram showing the parasitic circuit which conducts noise from the switching die to the IC die in FIG. 1.
Figure 3:
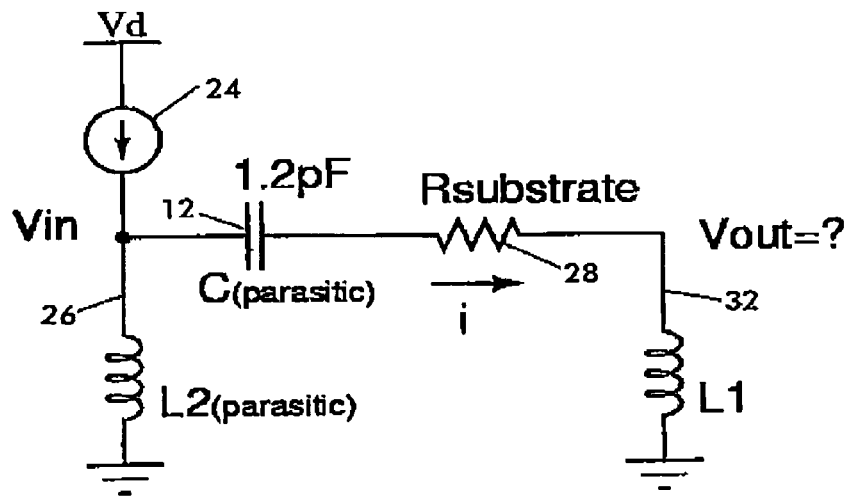
FIG. 3 schematically shows a circuit model for determining the noise present in the IC due to IGBT switching.

FIG. 3 illustrates a circuit diagram of the noise coupling model according the invention. As illustrated, IGBT 10 is modeled as a current source 24 connected to a ground lead 26 exhibiting a parasitic lead inductance $L_2$ and the noise path in IC 11 is modeled as series circuit 28 including the parasitic capacitance 12 associated with the dielectric layer, the substrate resistance R and an inductance $L_1$ of a ground pat 32 (see FIG. 1). The actual noise signal is produced as an output voltage $V_{OUT}$ at an assumed node 34 between the substrate resistance R and inductance $L_1$.

Using the model of FIG. 3, and Kirchoff's Current Law (and replacing C with $1/j\omega C$, and L with $j\omega L$) it may be seen that the output noise voltage $V_{OUT}$ which is present in the IC due to IGBT switching is:

$$V = \frac{V_{IN}S^2 L_2 C}{1 + RSC + S^2 L_1 C}$$

where:

$V_{IN}$=the voltage across inductance $L_2$ due to the di/dt of current source 24;

S=jω

R=the parasitic substrate resistance of IC 11;

C=the capacitance of the dielectric layer 12; and $L_1$ and $L_2$=the parasitic inductances of leads 26 and 32.

From this, it may be seen that if the values of $L_1$ and C can be reduced, the magnitude of the noise coupled to IC 11 will be smaller.

From study of the model, one can calculate the magnitude of the switching noises and understand this noise phenomenon. Accordingly, it has been recognized that to minimize the switching noise, a decoupling circuit will be required which exhibits a low impedance to ground and high impedance to both IGBT 10 and IC 11.

Figure 4:
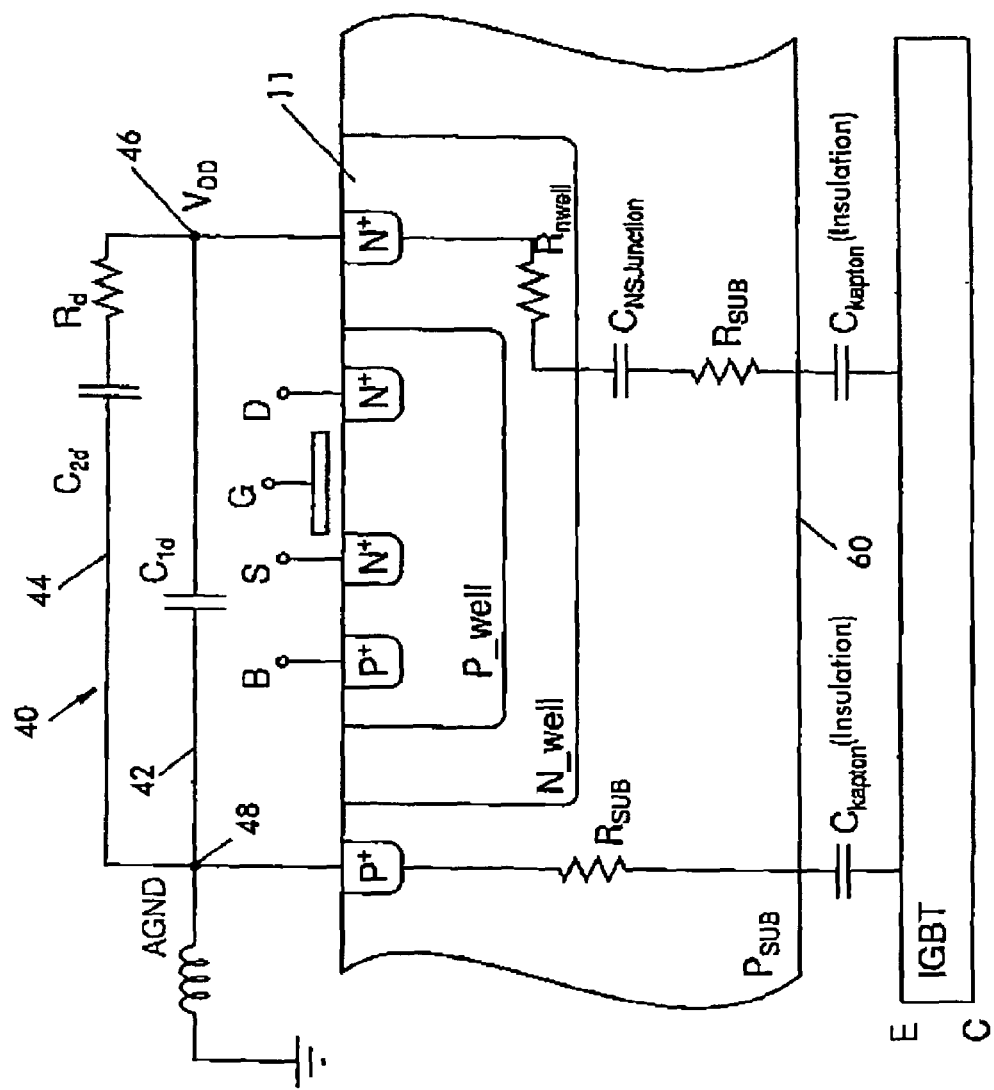
FIG. 4 shows a silicon cross-section corresponding to FIG. 1 with a novel damping circuit for damping switching noise.

A preferred embodiment of such a circuit is shown in FIG. 4 which is built into the IC 11. Here, decoupling circuit 40 includes a parallel circuit including a first branch 42 formed by a first damping capacitor $C_{1d}$, and a second branch 44 formed by a second damping capacitor $C_{2d}$ and a damping resistor $R_d$. The damping circuit is connected between a power supply input node 46 which receives voltage $V_{DD}$ and the IC ground connection node (AGND) 48.

The parasitic resistances and capacitances associated with substrate 60 of IC 11 and the insulating film 12 (see FIG. 1) are also illustrated.

Figure 5:
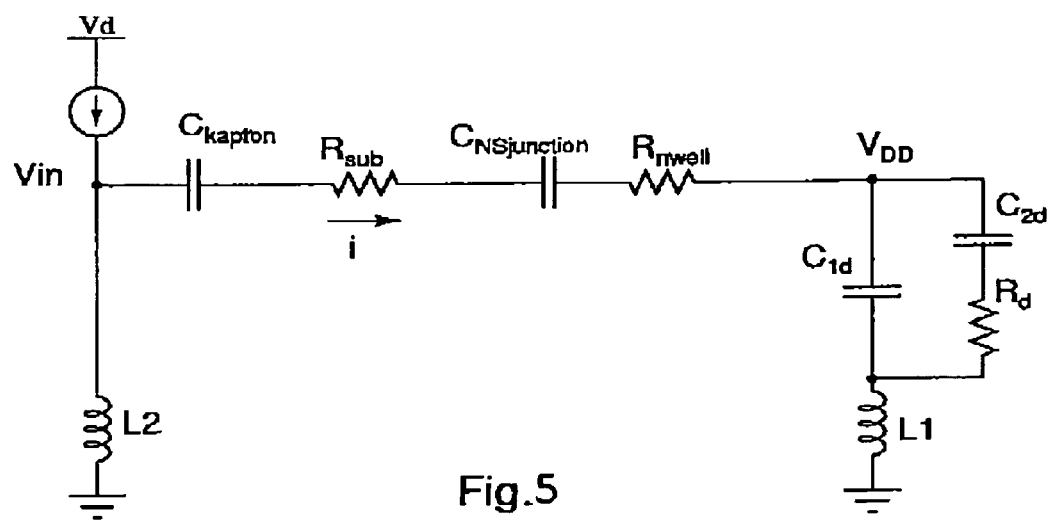
FIG. 5 shows schematic circuit diagram of the damping circuit of the invention.

FIG. 5 further shows the circuit 40 as including capacitor $C_{1d}$ and parallel connected $R_D$ and $C_{2d}$, all in series with $L_1$.

A damping circuit according to the invention minimizes the coupled switching noises and provides for the functioning of the integrated switches in noisy environments.

Thus, this invention models the noises in a co-packaged device, i.e. the noise paths between the two (or more) dice as well as the noise path on the ICs.

The proposed solution also enables the functionality of the integrated co-packaged device in a noisy operating environment.

Although the present invention has been described in relation to a particular embodiment thereof, many other variations and modifications and other uses will become apparent to those skilled in the art. It is intended, therefore, that the present invention is not be limited by the specific disclosure herein, but is to be given the full scope permitted by the appended claims.

I claim:

1. A semiconductor device comprising:
   at least two separate circuit units co-packaged with an insulating material between the units, and coupled together through parasitic impedance associated with the first unit, wherein the first unit is susceptible to noise generated by the second unit which is coupled through the parasitic impedance and the insulating material; and
   a decoupling circuit between the first and second units connected to a ground connection node of the first unit and a power supply node of the first unit.

2. A semiconductor device as described in claim 1, wherein the decoupling circuit exhibits a high impedance between the power supply node and the functional elements of the first and second units at frequencies associated with the noise, and a low impedance to the ground connection node from the power supply input node at the frequencies associated with the noise.

3. A semiconductor device as described in claim 1, wherein the decoupling circuit comprises a first branch formed by a capacitor and a second branch in parallel with the first branch formed by a resistor and a capacitor in series.

4. A semiconductor device comprising:
   a power transistor;
   an integrated circuit which provides a signal to a control terminal of the power transistor,
   the integrated circuit and the power transistor being co-packaged;
   and a decoupling circuit connected between a power supply node of the integrated circuit and a ground connection node of the integrated circuit,
   the decoupling circuit being configured and constructed to minimize the effect on the integrated circuit of switching noise generated by the power transistor.

5. A semiconductor device as described in claim 4, wherein the decoupling circuit exhibits a high impedance between the power supply node and the power transistor, and between the power supply node and the functional elements of this integrated circuit at frequencies associated wit the noise, and a low impedance to a ground connection node of the integrated circuit from the power supply node at the frequencies associated with the noise.

6. A semiconductor device as described in claim 4, wherein the decoupling circuit comprises a first branch formed by a capacitor and a second branch in parallel with the first branch formed by a resistor and a capacitor in series.

7. A method of reducing noise in a semiconductor device comprising at least two separate circuit units co-packaged with an insulating material between the units, and coupled together through parasitic impedance associated with the first unit, wherein the first unit is susceptible to noise generated by the second unit which is coupled through the parasitic impedance and the insulating material the method comprising the steps of:
   modeling a noise coupling mechanism between the second and first units based on the behavior of the parasitic impedance and the insulating material;
   designing a decoupling circuit in accordance with the coupling mechanism defined by the model to block transmission of signals at frequencies associated with the noise; and
   connecting the decoupling circuit between the first and second circuit units.

8. A method as described in claim 7, wherein the decoupling circuit is designed to present high impedance at a power supply node of the first unit and a low impedance bypass to a ground connection node of the first unit.

9. A method as described in claim 7, wherein the decoupling circuit comprises a first branch formed by a capacitor and a second branch in parallel with the first branch formed by a resistor and a capacitor in series.

10. A method as described in claim 9, wherein the decoupling circuit is connected between a power supply node of the first unit and a ground connection node of the first unit.

* * * * *